(12) United States Patent
Spina et al.

(10) Patent No.: US 12,095,423 B2
(45) Date of Patent: Sep. 17, 2024

(54) ENVELOPE DETECTOR CIRCUIT, CORRESPONDING RECEIVER CIRCUIT AND GALVANIC ISOLATOR DEVICE

(71) Applicant: STMicroelectronics S.r.l., Agrate Brianza (IT)

(72) Inventors: Nunzio Spina, Catania (IT); Egidio Ragonese, Aci Catena (IT); Giuseppe Palmisano, S. Giovanni la Punta (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 365 days.

(21) Appl. No.: 17/704,919

(22) Filed: Mar. 25, 2022

(65) Prior Publication Data

US 2022/0329207 A1 Oct. 13, 2022

(30) Foreign Application Priority Data

Mar. 30, 2021 (IT) .................. 102021000007844

(51) Int. Cl.
| | | |
|---|---|---|
| *G01R 19/04* | (2006.01) | |
| *H03F 1/02* | (2006.01) | |
| *H03F 3/19* | (2006.01) | |
| *H03F 3/45* | (2006.01) | |
| *H04B 1/00* | (2006.01) | |
| *H04B 1/40* | (2015.01) | |
| *H04B 17/00* | (2015.01) | |

(52) U.S. Cl.
CPC ............. *H03F 1/0233* (2013.01); *H03F 3/19* (2013.01); *H04B 1/40* (2013.01); *H03F 2200/105* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 6,980,006 | B1* | 12/2005 | Nguyen | ............. G01R 19/1659 |
| | | | | 324/522 |
| 7,224,191 | B1* | 5/2007 | Wang | ..................... G01R 19/10 |
| | | | | 327/60 |

(Continued)

OTHER PUBLICATIONS

IT Search Report and Written Opinion for priority application, IT Appl. No. 102021000007844, report dated Dec. 13, 2021, 8 pages.

(Continued)

*Primary Examiner* — Tuan A Tran
(74) *Attorney, Agent, or Firm* — Crowe & Dunlevy LLC

(57) ABSTRACT

A rectifier stage includes a differential input transistor pair coupled between a reference voltage node and an intermediate node, and a load circuit coupled between the intermediate node and a supply voltage node. The differential input transistor pair receives a radio-frequency amplitude modulated signal. A rectified signal indicative of an envelope of the radio-frequency amplitude modulated signal is produced at the intermediate node. An amplifier stage coupled to the intermediate node produces an amplified rectified signal at an output node that is indicative of the envelope of the radio-frequency amplitude modulated signal. The rectifier stage includes a resistive element coupled between the intermediate node and the supply voltage node in parallel to the load circuit.

24 Claims, 4 Drawing Sheets

(56) References Cited

U.S. PATENT DOCUMENTS

| | | | |
|---|---|---|---|
| 7,269,395 B2* | 9/2007 | Choi | G06K 19/07786 |
| | | | 455/67.11 |
| 7,302,055 B1* | 11/2007 | Horwitz | H04L 12/2803 |
| | | | 327/95 |
| 7,592,869 B2* | 9/2009 | Bae | H03F 3/45098 |
| | | | 330/254 |
| 8,254,595 B2* | 8/2012 | Fagg | H03D 1/00 |
| | | | 381/71.14 |
| 8,364,195 B2 | 1/2013 | Spina et al. | |
| 9,178,476 B2* | 11/2015 | Hadji-Abdolhamid | |
| | | | H03F 3/245 |
| 9,396,155 B2* | 7/2016 | Lin | H04B 17/00 |
| 9,625,498 B2* | 4/2017 | Eken | H04B 17/30 |
| 9,819,313 B2* | 11/2017 | Deo | H03G 3/3052 |
| 10,008,984 B2* | 6/2018 | Seth | H03F 3/45197 |
| 10,012,679 B2* | 7/2018 | Eken | H04B 17/30 |
| 10,270,395 B2* | 4/2019 | Jo | H03F 1/56 |
| 10,627,430 B2* | 4/2020 | Mukherjee | G01R 19/04 |
| 10,804,946 B2* | 10/2020 | Wang | H04B 1/1615 |
| 10,848,109 B2* | 11/2020 | Day | H03F 3/19 |
| 2011/0006846 A1* | 1/2011 | Miho | H03F 1/0266 |
| | | | 330/278 |
| 2014/0085007 A1* | 3/2014 | Hadji-Abdolhamid | |
| | | | H03F 3/45237 |
| | | | 330/297 |
| 2017/0214367 A1* | 7/2017 | Deo | H03F 3/45273 |
| 2017/0343589 A1* | 11/2017 | Mukherjee | H03D 1/2272 |
| 2019/0348955 A1* | 11/2019 | Day | H03F 3/19 |

OTHER PUBLICATIONS

Fiore Vincenzo et al: "Low-Power ASK Detector for Low Modulation Indexes and Rail-to-Rail Input Range", IEEE Transactions on Circuits and Systems II: Express Briefs, IEEE, USA, vol. 63, No. 5, May 1, 2016, pp. 458-462, XP011607869.

E. Ragonese, N. Spina, A. Castorina, P. Lombardo, N. Greco, A. Parisi, and G.Palmisano, "A fully integrated galvanically isolated DC-DC converter with data communication," IEEE Trans. Circuits Syst. I: Regular Papers, Early access, 3 pages.

Ragonese, Egidio, et al: "A CMOS Data Transfer System Based on Planar RF Coupling for Reinforced Galvanic Isolation with 25-kV Surge Voltage and 250-kV/μs CMTI," Electronics 2020, 9, 943; doi:10.3390/electronics9060943, 17 pages.

Lombardo, Pierpaolo, et al: ISSCC 2016 / Session 16 / Innovations in Circuits and Systems Enabled By Novel Technologies / 16.7 16.7 A Fully-Integrated Half-Duplex Data/Power Transfer System with up to 40Mb/s Data Rate, 23mW Output Power and On-Chip 5 kV Galvanic Isolation, 3 pages.

* cited by examiner

ENVELOPE DETECTOR CIRCUIT, CORRESPONDING RECEIVER CIRCUIT AND GALVANIC ISOLATOR DEVICE

PRIORITY CLAIM

This application claims the priority benefit of Italian Application for Patent No. 102021000007844, filed on Mar. 30, 2021, the content of which is hereby incorporated by reference in its entirety to the maximum extent allowable by law.

TECHNICAL FIELD

The description relates to envelope detector circuits and related devices.

One or more embodiments may be applied to galvanic isolators.

BACKGROUND

In recent years, several applications have been taking advantage of galvanic isolation, e.g., to improve safety and reliability, especially in adverse environments. Galvanic isolation is a desirable feature in certain automotive applications (e.g., driver devices for electric and hybrid vehicles), in the industrial environment (e.g., motor control, automation, and the like), in medical equipment, in consumer products (e.g., home appliances), in gate drivers for power devices (e.g., power MOS, SiC or GaN devices), and even in communication networks. A galvanic isolator facilitates data transfer across a galvanic barrier and allows bidirectional communication between two isolated interfaces.

A conventional galvanically-isolated system 10 is exemplified in FIG. 1, which is known from document Ragonese, et al., "A CMOS Data Transfer System Based on Planar RF Coupling for Reinforced Galvanic Isolation with 25-kV Surge Voltage and 250-kV/µs CMTI", Electronics, 2020; 9(6):943, doi: 10.3390/electronics9060943 (incorporated by reference and referred to as Ragonese, et al. hereinafter). An isolated system 10 comprises a first device $100_1$ and a second device $100_2$. The first device $100_1$ comprises, for instance, human/data interfaces, bus controllers, network controllers, microcontroller unit(s), and generally any component useful to provide an interface of the system 10 with the environment (e.g., a user). The second device $100_2$ comprises, for instance, sensor interfaces, gate drivers, medical devices, communication networks, and generally any component useful for operation of the system 10, depending on the application. The first device $100_1$ is coupled between a first supply terminal $102_1$ and a first reference terminal $GND_1$ (e.g., a ground or earth reference) to receive a first supply voltage $V_{DD1}$, and the second device $100_2$ is coupled between a second supply terminal $102_2$ and a second reference terminal $GND_2$ to receive a second supply voltage $V_{DD2}$. The first device $100_1$ and the second device $100_2$ are electrically isolated by a galvanic isolation barrier 104, and comprise means for transferring power 106 and/or data 108 between the two devices (i.e., across the isolation barrier 104).

Known galvanic isolators are typically based on electromagnetic coupling (e.g., capacitive or inductive coupling) across a dielectric layer (i.e., the galvanic barrier). In certain cases, galvanic isolation can be obtained by providing package-scale isolation barriers. In other terms, packaging/assembling techniques and radio-frequency (RF) coupling between micro-antennas can be used to provide isolation and data communication. For instance, some RF galvanic isolators exploit wireless transmission between two stacked chips by means of silicon integrated near-field antennas, as disclosed by U.S. Pat. No. 8,364,195 B2 (incorporated herein by reference). To reduce the distance between stacked antennas, the dice can be also assembled face to face at the cost of fabricating through hole vias (THV) to have a rear side connection. However, the chip assembling complexity and package cost militate against a widespread adoption of this isolation technology. These drawbacks can be mitigated if the two integrated circuit dies are placed side by side on the package substrate exploiting the magnetic coupling between coplanar antennas. In this case, the physical channel for data communication relies on the weak near-field coupling between two micro-antennas integrated on two side-by-side co-packaged chips, as illustrated in FIG. 2 (also known from Ragonese et al. cited previously).

As exemplified in FIG. 2, an isolated system 20 comprises a first integrated circuit chip $200_1$ and a second integrated circuit chip $200_2$ arranged on respective electrically isolated die pads $202_1$ and $202_2$ in a (molded) package 203. Each of the chips $200_1$, $200_2$ comprises a respective planar micro-antenna $204_1$, $204_2$. In this approach, the distance through insulation (DTI), which determines the isolation rating, can be increased. Standard molding compounds have a dielectric strength ($E_M$) of at least 50 V/µm, and therefore with a DTI of about 400 µm to 500 µm, an isolation rating higher than 20 kV can be achieved. Moreover, the intrinsic parasitic capacitance of the isolated channel can be reduced if compared with that of traditional chip-scale barriers (i.e., isolation capacitors or stacked transformers), thus reducing common mode (CM) currents produced by rapid ground shifts (i.e., CM transients).

FIG. 3 (also known from Ragonese et al. cited previously) is a simplified circuit block diagram exemplary of an isolated data transfer channel of an isolated system (e.g., 10 or 20), and FIG. 4 is exemplary of possible time behavior of electrical signals in the system.

Data transmission across a galvanic isolation barrier may rely on amplitude modulation of a radio-frequency (RF) carrier wave, in particular using on-off keying (OOK) pulse width modulation (PWM) of the RF carrier wave. A transmitting chip $200_1$ comprises an input pin $300_1$ for receiving an input digital signal IN carrying input data (e.g., a sequence of "0" or "1" bits), and a base-band interface (BBIF) $302_1$ (e.g., a PWM modulator circuit) which receives the input digital signal IN and produces a corresponding input PWM signal $PWM_{IN}$ for driving a transmission front-end circuit $304_1$. For instance, the signal $PWM_{IN}$ comprises periods with a low duty-cycle (e.g., 25% or less) to encode a "0" bit value, and periods with a high duty-cycle (e.g., 75% or more) to encode a "1" bit value, as exemplified in FIG. 4. The transmission front-end circuit $304_1$ modulates the amplitude of a radio-frequency carrier wave as a function of the PWM signal $PWM_{IN}$ (e.g., applying ASK modulation, in particular OOK modulation) to produce the transmission signal Sm which is then transmitted by a transmitting antenna $204_1$ coupled to the transmission front-end circuit $304_1$. The receiving chip $200_2$, on the other side of the isolation barrier 306, comprises a reception front-end circuit $304_2$ coupled to the receiving antenna $204_2$ to receive the transmission signal Sm therefrom. The reception front-end circuit $304_2$ comprises an envelope detector circuit which detects the envelope of the transmission signal Sm' to produce an output PWM signal $PWM_{OUT}$. The output PWM signal $PWM_{OUT}$ is provided to a base-band interface $302_2$ for data demodulation (e.g., a PWM demodulator circuit), which produces an output digital signal OUT at an output pin $300_2$.

Therefore, the front-end circuit $304_2$ in the receiving chip $200_2$ is configured to rectify (e.g., perform envelope detection) and amplify the low-level radio-frequency signal Sm received so as to convert it into a PWM low frequency signal $PWM_{OUT}$, thereby allowing inter-chip data communication with two micro-antennas which transmit and receive, respectively, a carrier signal.

Ragonese et al. cited previously provides an example of such a receiving front-end circuit, as exemplified in FIGS. 5 and 6. FIG. 5 is a simplified circuit block diagram exemplary of an isolated data transfer channel, and FIG. 6 is a circuit block diagram exemplary of a portion of a corresponding receiving front-end circuit.

As exemplified in FIG. 5, a receiving front-end circuit $304_2$ comprises a gain stage 50, a mixer stage 52 coupled to the output of the gain stage 50, and a low-pass filter stage 54 coupled to the output of the mixer stage 52. The received radio-frequency signal $S_{RF}$ is first amplified at the gain stage 50 to obtain a signal having an amplitude suitable to drive the rectifier (e.g., amplifying the signal from about 80 mV amplitude to about 400 mV amplitude). The mixer stage 52 and the low-pass filter stage 54 (which together can be referred to as a rectifier stage in the context of the present description) then detect the envelope of the (amplified) input RF signal $S_{RF}$ and generate an envelope signal $ENV_{OUT}$. The rectified (envelope) signal $ENV_{OUT}$ is then compared to a threshold to generate the output PWM signal $PWM_{OUT}$ (the comparator circuit not being visible in the Figures annexed herein).

FIG. 6 is a circuit diagram exemplary of a rectifier stage as known from Ragonese et al. cited previously: it consists of a differential amplifier with resistive load, with a double-balanced mixer based on a Gilbert cell. The output RC load of the mixer stage provides low-pass filtering to clean the RX signal envelope. Such a solution as disclosed by Ragonese et al. cited previously is affected by a high current consumption due to both RF amplification and frequency limitations in the mixer-based rectifier.

The reference Fiore, et al., "Low-Power ASK Detector for Low Modulation Indexes and Rail-to-Rail Input Range," in IEEE Transactions on Circuits and Systems II: Express Briefs, vol. 63, no. 5, pp. 458-462, May 2016, doi: 10.1109/TCSII.2015.2503651 (incorporated herein by reference and referred to as Fiore, et al. hereinafter) discloses another example of an envelope detection circuit. However, that solution is not practical for use at low data rates, insofar as it cannot be fully integrated and needs external components.

Therefore, there is a need in the art to provide an envelope detector circuit capable of converting a low-level radio-frequency carrier signal in a low frequency PWM signal, particularly for low data rate applications.

SUMMARY

One or more embodiments provide improved envelope detection circuits, e.g., for use in galvanic isolators, which can be fully integrated and operate at low data rates.

One or more embodiments relate to a circuit (e.g., an envelope detection circuit).

One or more embodiments relate to a corresponding receiver circuit.

One or more embodiments relate to a corresponding galvanic isolator device.

In one or more embodiments, a circuit comprises a rectifier stage including a differential input transistor pair coupled between a reference voltage node and an intermediate node, and a load coupled between the intermediate node and a supply voltage node. The differential input transistor pair is configured to receive a radio-frequency amplitude modulated signal. A rectified signal indicative of an envelope of the radio-frequency amplitude modulated signal is produced at the intermediate node. The circuit comprises an amplifier stage coupled to the intermediate node to receive the rectified signal, and configured to produce at an output node an amplified rectified signal indicative of the envelope of the radio-frequency amplitude modulated signal. The rectifier stage comprises a first resistive element coupled between the intermediate node and the supply voltage node in parallel to the load.

One or more embodiments thus provide an envelope detector circuit which can operate at low data rates and can be fully integrated into a semiconductor chip.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for brevity.

Figure 7:
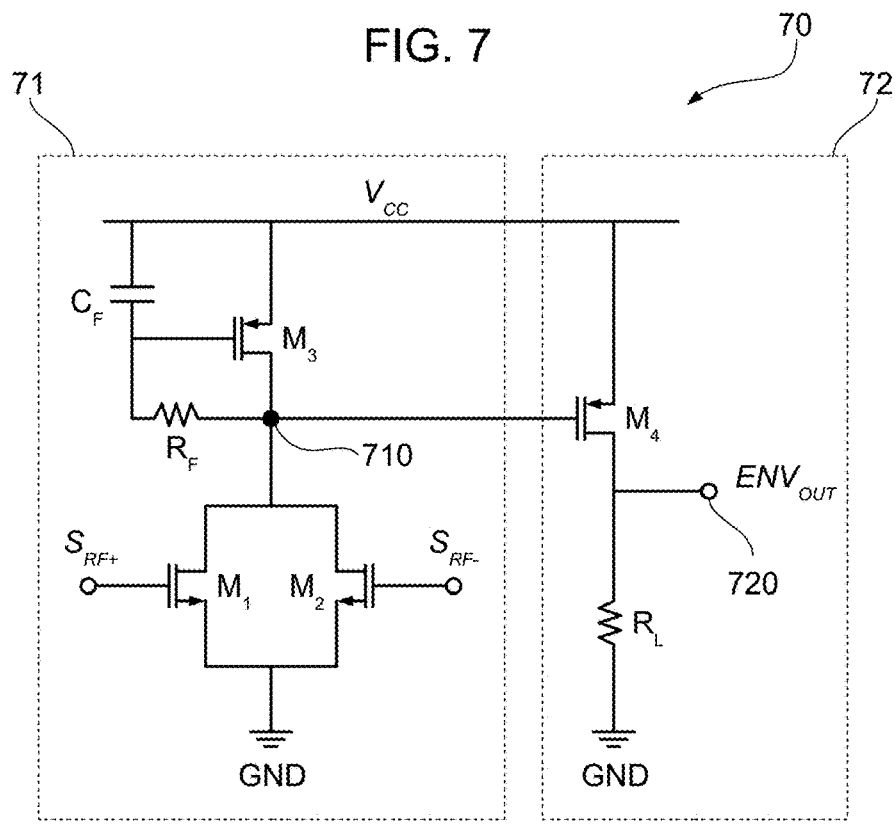
FIG. 7 is a circuit diagram exemplary of an envelope detector circuit.

By way of introduction to the detailed description of exemplary embodiments, reference may first be made to FIG. 7, which is a circuit diagram exemplary of a two-stage envelope detector circuit 70 suitable for use in an amplitude-shift keying (ASK) detector.

As exemplified in FIG. 7, the envelope detector circuit 70 comprises an input stage 71 and an output stage 72.

The input stage 71 comprises an input differential pair comprising two transistors (e.g., n-channel MOS transistors) $M_1$ and $M_2$. The input radio-frequency signal $S_{RF}$ is applied between the (gate) control terminals of the two transistors $M_1$ and $M_2$ of the differential pair. The transistors $M_1$, $M_2$ have their source terminals coupled to a reference voltage node GND and their drain terminals coupled to a common intermediate node 710.

The input stage 71 comprises a load coupled between the common intermediate node 710 and a supply node which provides a supply voltage $V_{CC}$. For instance, as exemplified in FIG. 7, the load comprises an active (e.g., self-biased) load including a transistor $M_3$ and a low-pass filter $R_F$, $C_F$. The transistor $M_3$ (e.g., a p-channel MOS transistor) has its current path arranged between the common intermediate node 710 and the supply node $V_{CC}$. The low-pass filter comprises a resistive element (e.g., a resistor $R_F$) coupled between the common intermediate node 710 and the (gate) control terminal of the transistor $M_3$, and a capacitive element (e.g., a capacitor $C_F$) coupled between the (gate) control terminal of the transistor $M_3$ and the supply node $V_{CC}$.

The output stage 72 comprises a common source or common emitter arrangement including a transistor $M_4$ and a resistive load $R_L$, the transistor $M_4$ and the resistive load $R_L$ being coupled in series between the supply node $V_{CC}$ and the reference voltage node GND. The transistor $M_4$ has a (gate) control terminal coupled to the common intermediate node 710 (acting as the output node of the first stage 71). An output node 720 intermediate the transistor $M_4$ and the resistive load $R_L$ provides the envelope output signal $ENV_{OUT}$. In particular, the transistor $M_4$ is a p-channel MOS transistor having a source terminal coupled to the supply node $V_{CC}$ and a drain terminal coupled to the output node 720, and the resistive load $R_L$ is coupled between the drain terminal of transistor $M_4$ and the reference voltage node GND.

Therefore, in an envelope detector circuit 70 as exemplified in FIG. 7, the (on-off) modulated differential input signal $S_{RF}$ is first rectified and then amplified to produce an envelope signal $ENV_{OUT}$. The output node 720 of the envelope detector circuit 70 is coupled to a comparator circuit (not visible in the Figures) so that the envelope signal $ENV_{OUT}$ is converted into a single-ended rail-to-rail PWM data signal $PWM_{OUT}$.

It is noted that a circuit as exemplified in FIG. 7 can be fully integrated in a silicon die (only) for use in high data rate communications. The small-signal loop gain T and the loop gain-bandwidth product $f_{GBW}$ can be computed according to the equations below:

$$T = \frac{g_{m3} \cdot r_{o1}}{1 + sR_FC_F}$$

$$f_{GBW} = \frac{g_{m3} \cdot r_{o1}}{2\pi R_F C_F}$$

Assuming, by way of example, a high data rate equal to $f_{BR}$=100 Mb/s, then $f_{GBW}=f_{BR}/25$=4 MHz, and assuming also $R_F$=10 kΩ this leads to $C_F$=120 pF which is a high value, but still feasible to integrate into a silicon die.

Assuming instead, again by way of example only, a low data rate equal to $f_{BR}$=400 kb/s, then $f_{GBW}=f_{BR}/25$=16 kHz, and assuming also $R_F$=75 kΩ this leads to $C_F$=4 nF which is a capacitance value too high to integrate into a silicon die.

Therefore, at low data rates an envelope detector circuit as exemplified in FIG. 7 requires an external component (e.g., an external capacitor $C_F$).

Figure 8:
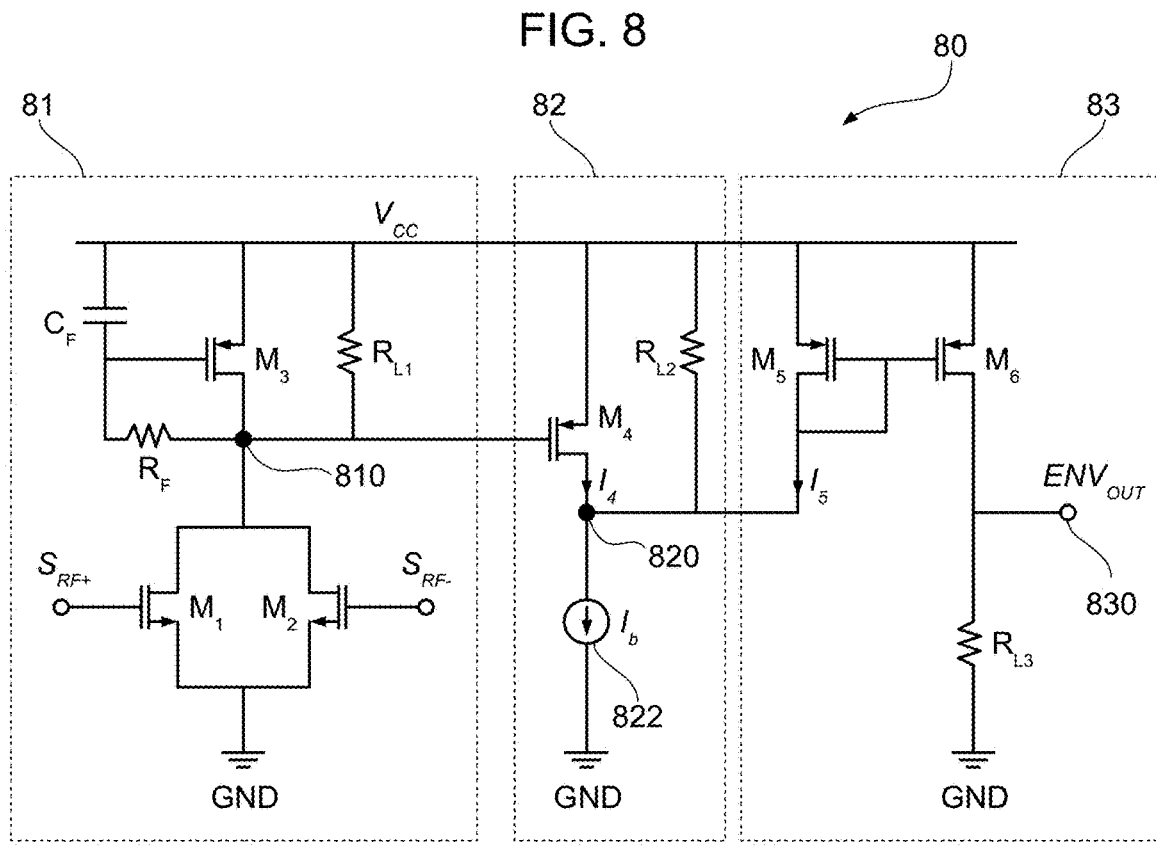
FIG. 8 is a circuit diagram exemplary of an envelope detector circuit according to one or more embodiments of the present description.

One or more embodiments relate to an improved envelope detector circuit suitable for use (also) at low data rates, as exemplified in FIG. 8, which is a circuit diagram exemplary of a three-stage envelope detector circuit 80 suitable for use in an amplitude-shift keying (ASK) detector.

As exemplified in FIG. 8, the envelope detector circuit 80 comprises an input stage 81, an intermediate stage 82 and an output stage 83.

The input stage 81 comprises an input differential pair comprising two transistors (e.g., n-channel MOS transistors) $M_1$ and $M_2$. The input radio-frequency signal $S_{RF}$ is applied between the (gate or base) control terminals of the two transistors $M_1$ and $M_2$ of the differential pair. The transistors $M_1$, $M_2$ have their source or emitter terminals coupled to a reference voltage node GND and their drain or collector terminals coupled to a common intermediate node 810. The input stage 81 further comprises a load coupled between the common intermediate node 810 and a supply node providing a supply voltage $V_{CC}$. For instance, as exemplified in FIG. 8, the load comprises an active (e.g., self-biased) load including a transistor $M_3$ and a low-pass filter $R_F$, $C_F$. The transistor $M_3$ (e.g., a p-channel MOS transistor) has its current path arranged between the common intermediate node 810 and the supply node $V_{CC}$. The low-pass filter comprises a resistive element (e.g., a resistor $R_F$) coupled between the common intermediate node 810 and the (gate or base) control terminal of the transistor $M_3$, and a capacitive element (e.g., a capacitor $C_F$) coupled between the (gate or base) control terminal of the transistor $M_3$ and the supply node $V_{CC}$.

As exemplified in FIG. 8, the input stage 81 further comprises a resistive element $R_{L1}$ coupled in parallel to the active load, e.g., coupled between the common intermediate node 810 and the supply node $V_{CC}$. Arranging a further resistive element $R_{L1}$ in the input stage 81 provides a further degree of freedom in the design of the envelope detector circuit 80, so that the resistive element $R_F$ can be set (e.g., dimensioned) to reduce the loop gain-bandwidth product $f_{GBW}$, which in turn facilitates implementing the capacitive element $C_F$ as an integrated component, while $R_{L1}$ can be set (e.g., dimensioned) so as to determine the gain and output pole frequency of the input stage 81, thus mitigating (e.g., avoiding) edge distortions on the output PWM signal.

The intermediate stage 82 comprises a current matching circuit arrangement. As exemplified in FIG. 8, the intermediate stage 82 comprises a transistor $M_4$ (e.g., a p-channel MOS transistor) having a current path arranged between the supply node $V_{CC}$ and a bias source 822, and a control (gate or base) terminal coupled to the intermediate node 810 of the input stage 81. A current $I_4$ flows through the transistor $M_4$. For instance, the transistor $M_4$ has a source or emitter terminal coupled to the supply node $V_{CC}$ and a drain or collector terminal coupled to a further intermediate node 820, and the bias source 822 comprises a current generator arranged between the intermediate node 820 and the reference voltage node GND to sink a bias current $I_b$ from the intermediate node 820 towards the reference voltage node GND.

Additionally, the intermediate stage 82 comprises a resistive element $R_{L2}$ coupled in parallel to the current path of transistor $M_4$, e.g., coupled between the intermediate node 820 and the supply node $V_{CC}$. Arranging a resistive element $R_{L2}$ in the intermediate stage 82 facilitates restoring the matching conditions between the first stage 81 (transistor $M_3$ and resistance $R_{L1}$) and the second stage 82 (transistor $M_4$ and resistance $R_{L2}$), thus improving the accuracy in the bias current $I_5$ of the output stage 83.

The output stage 83 comprises an amplifier stage, e.g., a folded amplifier stage. As exemplified in FIG. 8, the output stage 83 comprises a current mirror arrangement comprising a first transistor $M_5$ (e.g., a p-channel MOS transistor) and a second transistor $M_6$ (e.g., a p-channel MOS transistor). The first transistor $M_5$ has a current path arranged between the supply node $V_{CC}$ and the intermediate node 820, through which a current $I_5=I_b-I_4$ flows. The second transistor $M_6$ is arranged in series to an output load $R_{L3}$ (e.g., a resistive load) between the supply node $V_{CC}$ and the reference voltage node GND, so that a copy of current $I_5$ flows through $M_6$ and $R_{L3}$, thereby providing a single-ended output signal $ENV_{OUT}$ at the node 830 intermediate the transistor $M_6$ and the load $R_{L3}$.

The folded amplifier comprising transistors $M_5$ and $M_6$ allows increasing the resistance value of the load $R_{L3}$ and therefore the value of the second stage gain, insofar as the unipolar output signal $ENV_{OUT}$ becomes a positive voltage. Thus, the output bias voltage can be set to a value close to $V_{CC}$. Purely by way of non-limiting example, with $V_{CC}=3.5$ V the resistance $R_{L3}$ is twice as big as the output load of a traditional configuration (e.g., $R_L$ in FIG. 7), thereby providing an additional gain of about 6 dB.

The output node 830 of the envelope detector circuit 80 is coupled to a comparator circuit (not visible in the Figures) so that the envelope signal $ENV_{OUT}$ is converted into a single-ended rail-to-rail PWM data signal $PWM_{OUT}$.

It is noted that one or more embodiments as exemplified in FIG. 8 can be fully integrated in a silicon die (also) for use in low data rate communications. The small-signal loop gain T and the loop gain-bandwidth product $f_{GBW}$ can be computed according to the equations below:

$$T = \frac{g_{m3} \cdot (r_{o1} // R_{L1})}{1 + sR_F C_F} \approx \frac{g_{m3} \cdot R_{L1}}{1 + sR_F C_F}$$

$$f_{GBW} = \frac{g_{m3} \cdot R_{L1}}{2\pi R_F C_F}$$

Assuming, by way of example, a low data rate equal to $f_{BR}=400$ kb/s, then $f_{GBW}=f_{BR}/25=16$ kHz, and assuming also $R_F=2$ MΩ and $R_{L1}=75$ kΩ this leads to $C_F=50$ pF which is a capacitance value which can be integrated into a silicon die.

Figure 1:
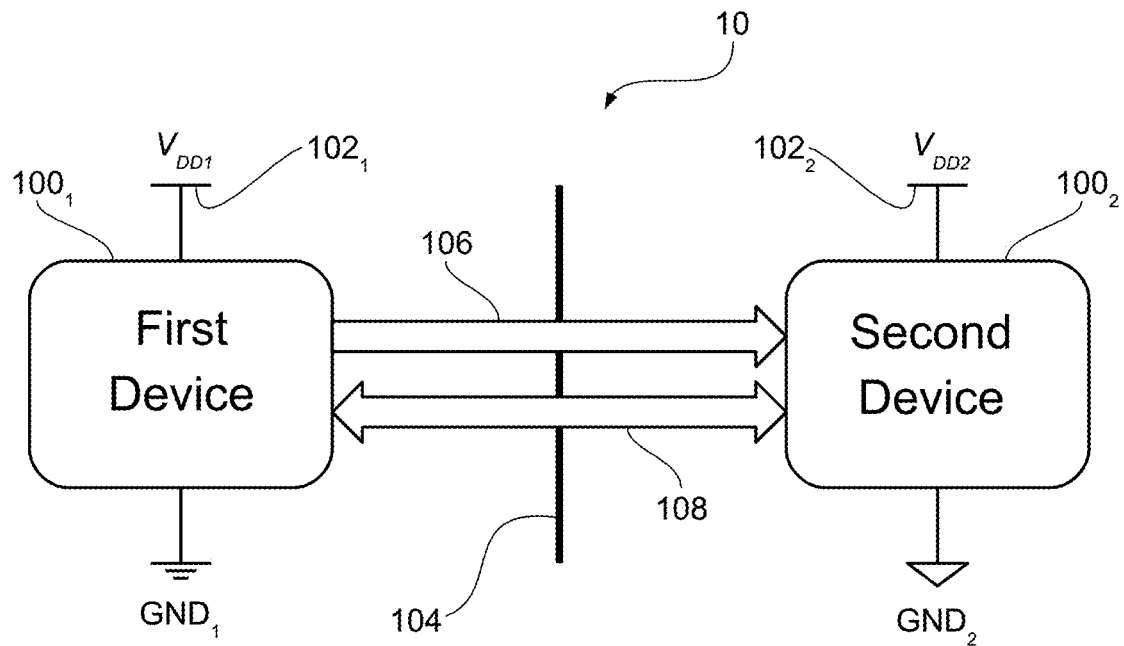
FIG. 1 illustrates a conventional galvanically-isolated system.
Figure 2:
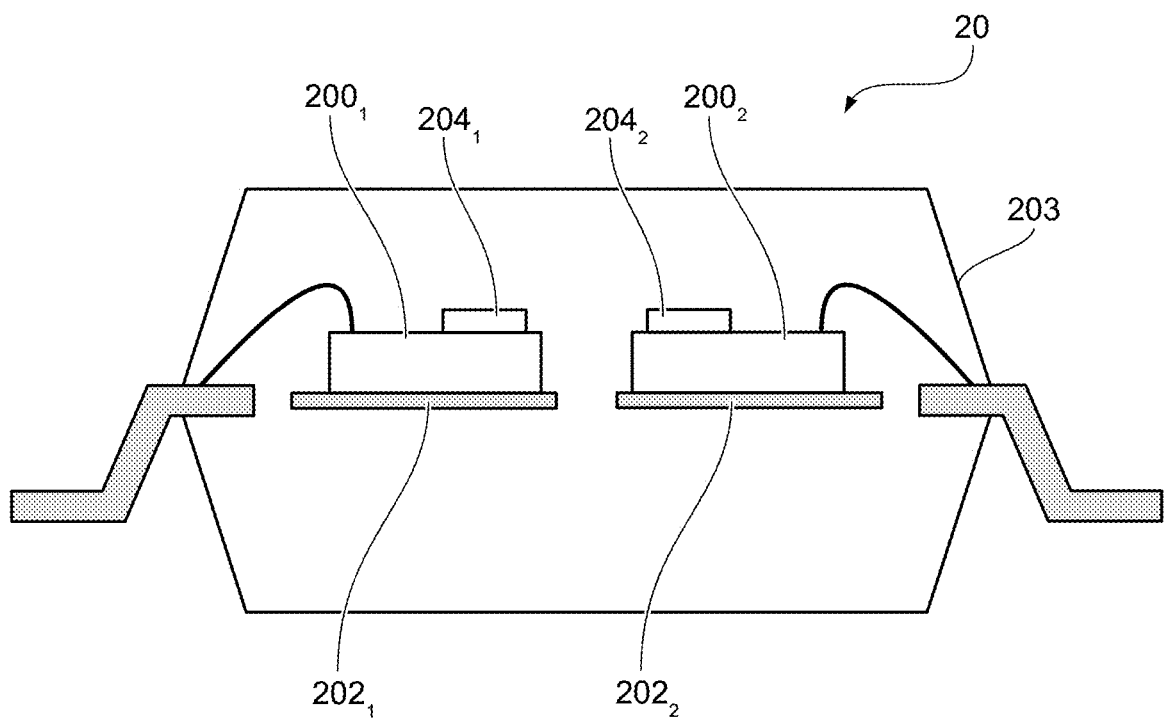
FIG. 2 shows an isolated system comprising a first integrated circuit chip and a second integrated circuit chip.
Figure 3:
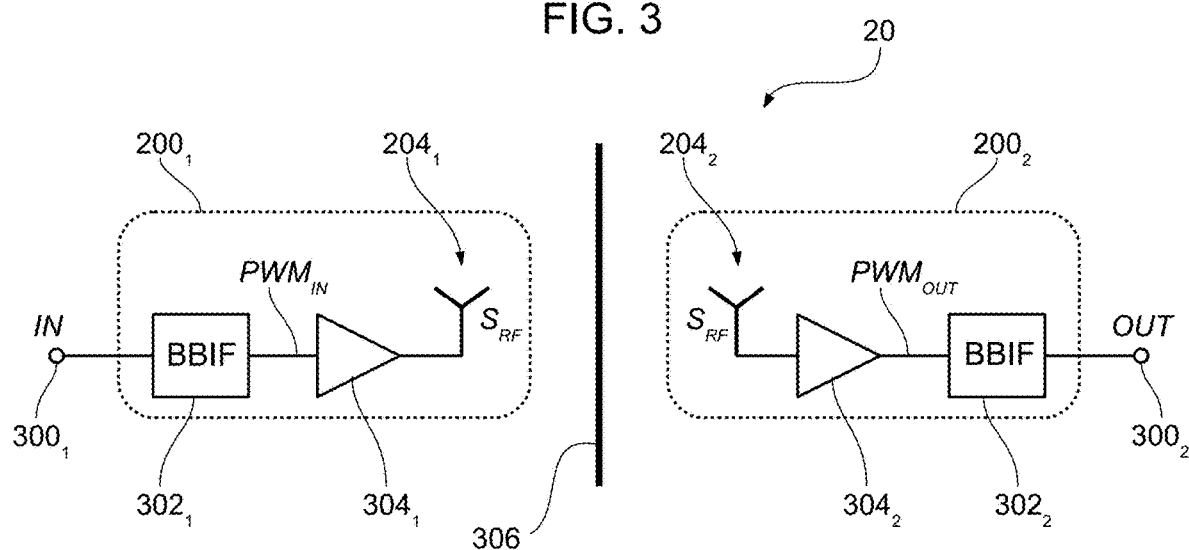
FIG. 3 is a simplified circuit block diagram exemplary of an isolated data transfer channel of an isolated system.
Figure 4:
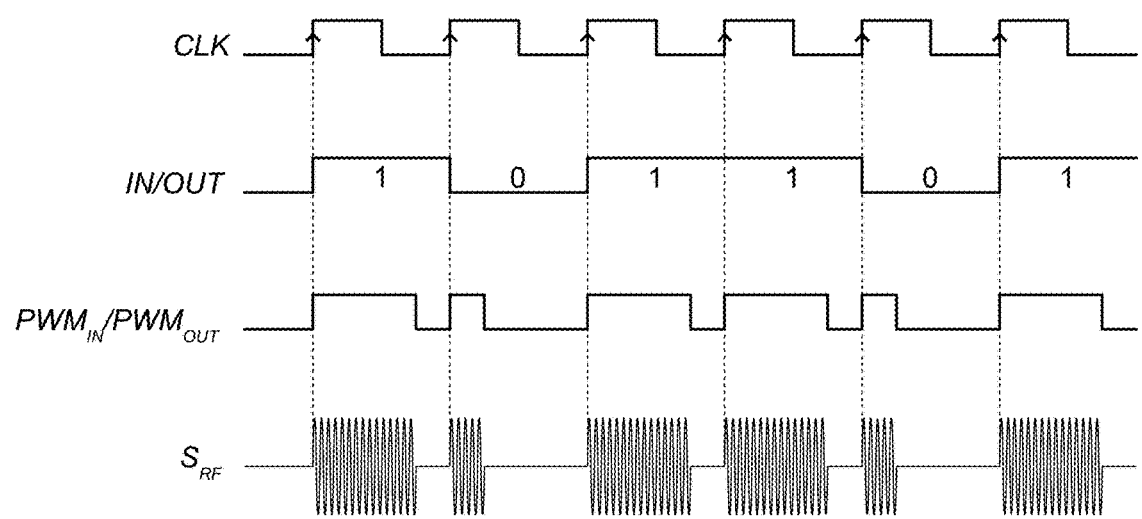
FIG. 4 is exemplary of possible time behavior of electrical signals in the system of FIG. 3.
Figure 5:
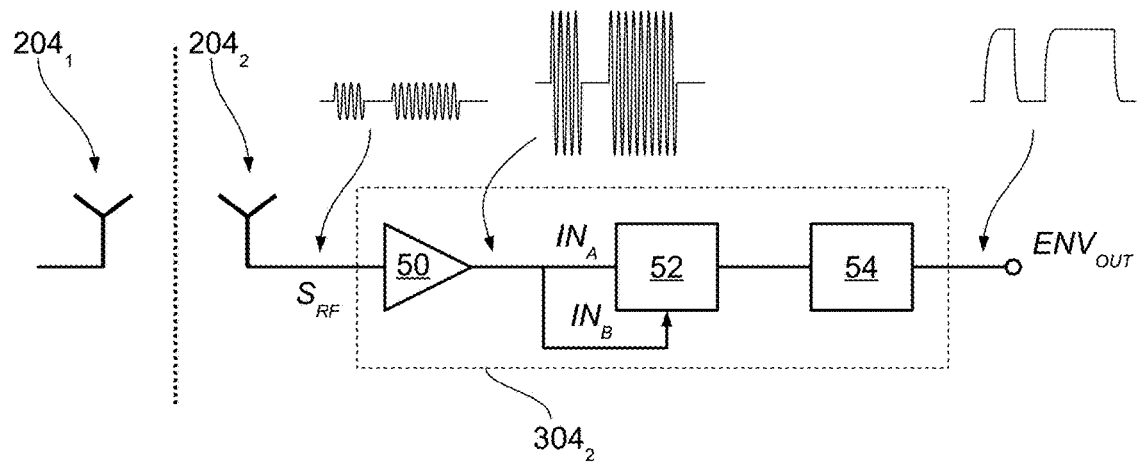
FIG. 5 shows a receiving front-end circuit.
Figure 6:
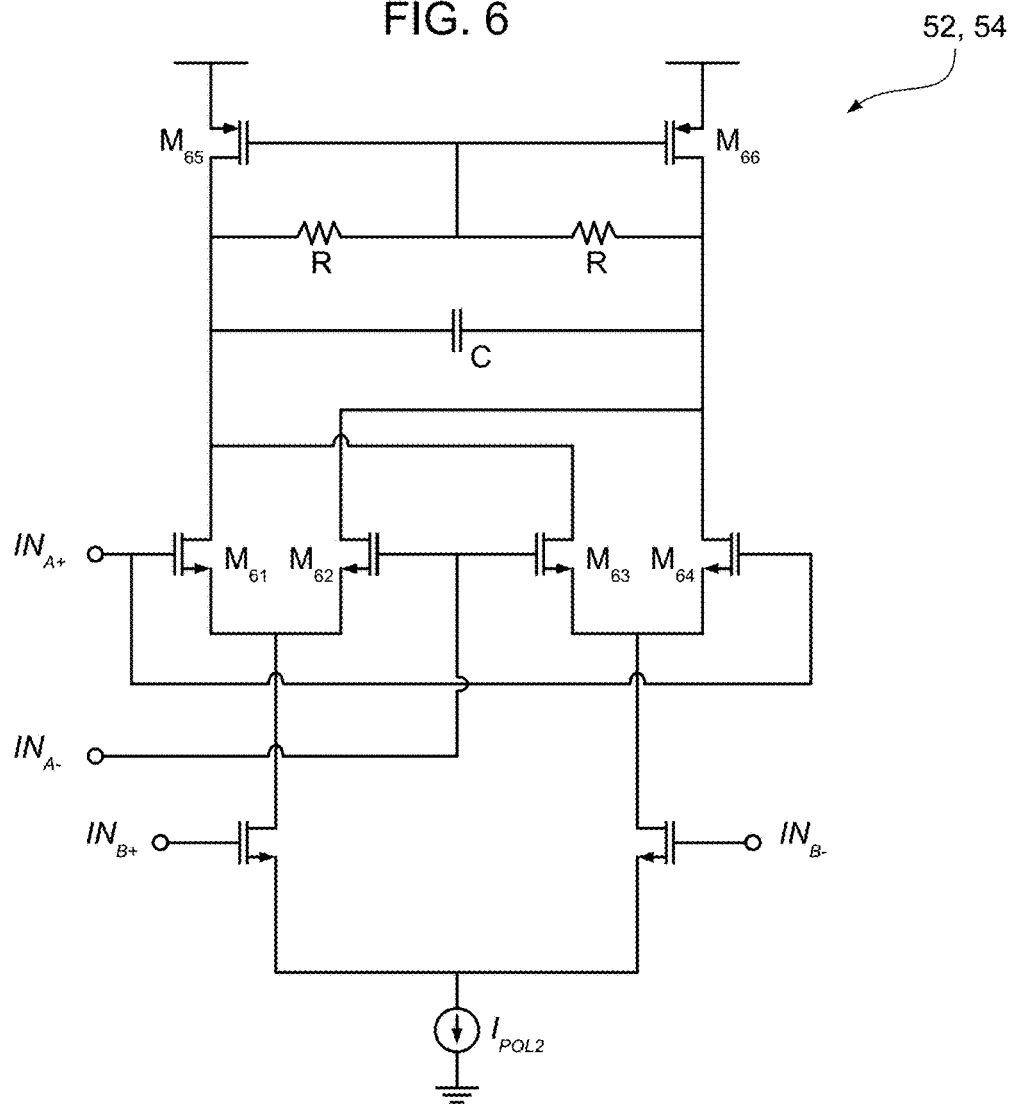
FIG. 6 is a circuit diagram exemplary of a rectifier stage.

One or more embodiments may be applied in a package-scale galvanic isolator device (e.g., as illustrated in FIG. 2), where galvanic isolation can be implemented without using specific high voltage components, the inter-chip communication channel can be implemented by means of a wireless radio-frequency transmission, and appropriately choosing the distance between the two chips facilitates achieving high isolation rating (e.g., 10 to 12 kV for reinforced isolation) and/or higher common mode transient immunity, CMTI (e.g., higher than 100 kV).

However, those of skill in the art will understand that reference to a package-scale galvanic isolator device is made by way of example only, and that one or more embodiments may be generally applied to any kind of galvanic isolator device.

One or more embodiments have been disclosed herein with reference to specific implementations using complementary MOS technology. Those of skill in the art will understand that bipolar (BJT) technology can also be adopted as implementation technology for one or more embodiments, provided that it includes complementary transistors.

One or more embodiments may thus provide an envelope detector circuit which can be fully integrated in a single chip (also) for use at low data rates, e.g., without using passive discrete components to operate the circuit at low data rates. By way of example, such envelope detector circuits may operate at frequencies lower than 1 MHz (e.g., in certain applications such as gate driver for motor control).

One or more embodiments may additionally provide one or more of the following advantages: high immunity to common mode transients, low current consumption, high gain, and low cost.

As exemplified herein, a circuit (e.g., 80) comprises a rectifier stage (e.g., 81) including a differential input transistor pair (e.g., $M_1$, $M_2$) coupled between a reference voltage node (e.g., GND) and an intermediate node (e.g., 810), and a load (e.g., $M_3$, $R_F$, $C_F$) coupled between the intermediate node and a supply voltage node (e.g., $V_{CC}$). The differential input transistor pair is configured to receive a radio-frequency amplitude modulated signal (e.g., $S_{RF+}$, $S_{RF-}$). A rectified signal indicative of an envelope of the radio-frequency amplitude modulated signal is produced at the intermediate node. The circuit comprises an amplifier stage (e.g., 82; 83) coupled to the intermediate node to receive the rectified signal and configured to produce at an output node (e.g., 830) an amplified rectified signal (e.g., $ENV_{OUT}$) indicative of the envelope of the radio-frequency amplitude modulated signal. The rectifier stage further comprises a first resistive element (e.g., Ru) coupled between the intermediate node and the supply voltage node in parallel to the load.

As exemplified herein, the load comprises an active load including a load transistor (e.g., $M_3$) and a low-pass circuit arrangement (e.g., $R_F$, $C_F$).

As exemplified herein, the active load comprises the load transistor having a current path coupled between the intermediate node and the supply voltage node, a second resistive element (e.g., $R_F$) coupled between the intermediate node and a control terminal of the load transistor, and a capacitive element (e.g., $C_F$) coupled between the control terminal of the load transistor and the supply voltage node.

As exemplified herein, the first resistive element has a resistance value in the range of 25 kΩ to 50 kΩ, and the second resistive element has a resistance value in the range of 1 MΩ to 3 MΩ. For instance, the first resistive element is sized to correctly polarize the transistors $M_1$, $M_2$ and together with the biasing current (e.g., $2*I_{d1,2}$ where Id is the current flowing through one of the transistors $M_1$, $M_2$) defines the gain of the first stage. For instance, an amplitude gain in the range of 2 to 3 is obtained.

As exemplified herein, the capacitive element has a capacitance value in the range of 50 pF to 150 pF.

As exemplified herein, the differential input transistor pair comprises a first input transistor (e.g., $M_1$) and a second input transistor (e.g., $M_2$) having the current paths therethrough arranged in parallel between the reference voltage node and the intermediate node, and the control terminals of the first input transistor and the second input transistor are configured to receive the radio-frequency amplitude modulated signal therebetween.

As exemplified herein, the amplifier stage comprises an output transistor (e.g., $M_6$) arranged in a common source or common emitter configuration and an output load (e.g., $R_{L3}$) coupled between a drain or collector terminal of the output transistor and the reference voltage node, and the output node is intermediate the drain or collector terminal of the output transistor and the output load.

As exemplified herein, the amplifier stage comprises:
a current-matching transistor (e.g., $M_4$) having a current path arranged between the supply voltage node and a current control node (e.g., 820), and a control terminal coupled to the intermediate node;
a bias source (e.g., 822) coupled between the current control node and the reference voltage node to sink a current (e.g., $I_b$) from the current control node, and
a current-mirroring transistor (e.g., $M_5$) having a current path arranged between the supply voltage node and the current control node) and having a drain or collector terminal coupled to its control terminal.

As exemplified herein, the control terminal of the current-mirroring transistor is coupled to a control terminal of the output transistor.

As exemplified herein, the circuit comprises a current-matching resistive element (e.g., $R_{L2}$) coupled between the supply voltage node and the current control node.

As exemplified herein, the current-matching resistive element has a resistance value in the range of 25 kΩ to 50 kΩ. For instance, the current-matching resistive element is sized to correctly polarize the transistor $M_4$ and together with the biasing current $I_b$ it defines the gain of the second stage.

As exemplified herein, the circuit comprises a comparator circuit configured to compare the amplified rectified signal to a threshold signal to generate a pulse-width modulated output signal (e.g., $PWM_{OUT}$) indicative of the envelope of the radio-frequency amplitude modulated signal.

As exemplified herein, a receiver circuit (e.g., 200₂) comprises:
a radio-frequency antenna (e.g., 204₂) configured to receive a radio-frequency amplitude modulated signal (e.g., $S_{RF}$);
an envelope detector circuit according to one or more embodiments configured to receive the radio-frequency amplitude modulated signal from the antenna and to generate the pulse-width modulated output signal indicative of the envelope of the radio-frequency amplitude modulated signal received; and
a PWM demodulator circuit (e.g., 302₂) configured to demodulate the pulse-width modulated output signal to generate an output digital data signal (e.g., OUT).

As exemplified herein, an isolator device (e.g., 20) comprises a transmitter circuit (e.g., 200₁) configured to transmit a radio-frequency amplitude modulated signal, and a receiver circuit according to one or more embodiments, and the transmitter circuit and the receiver circuit are isolated by a galvanic isolation barrier (e.g., 306).

As exemplified herein, the transmitter circuit and the receiver circuit are provided as separate chips arranged on respective electrically-isolated die pads (e.g., 202₁, 202₂), and the isolator device further comprises a molded package (e.g., 203) providing the galvanic isolation barrier.

Without prejudice to the underlying principles, the details and embodiments may vary, even significantly, with respect to what has been described by way of example only, without departing from the extent of protection.

The claims are an integral part of the technical teaching provided herein in respect of the embodiments.

The extent of protection is determined by the annexed claims.

The invention claimed is:
1. A circuit, comprising:
a rectifier stage including:
a differential input transistor pair coupled between a reference voltage node and an intermediate node, the differential input transistor pair being configured to receive a radio-frequency amplitude modulated signal;
a load circuit coupled between the intermediate node and a supply voltage node; and
a first resistive element coupled between said intermediate node and said supply voltage node in parallel with said load circuit;
wherein a rectified signal indicative of an envelope of said radio-frequency amplitude modulated signal is produced at said intermediate node; and
an amplifier stage coupled to receive said rectified signal from said intermediate node and configured to produce an amplified rectified signal at an output node.

2. The circuit of claim 1, wherein said load circuit is an active load circuit including a load transistor and a low-pass circuit.

3. The circuit of claim 2, wherein said load transistor has a current path coupled between said intermediate node and said supply voltage node, and where said low-pass circuit comprises: a second resistive element coupled between said intermediate node and a control terminal of said load transistor, and a capacitive element coupled between said control terminal of said load transistor and said supply voltage node.

4. The circuit of claim 3, wherein said first resistive element has a resistance value in a range of 25 kΩ to 50 kΩ, and wherein said second resistive element has a resistance value in a range of 1 MΩ to 3 MΩ.

5. The circuit of claim 1, wherein said differential input transistor pair comprises a first input transistor and a second input transistor having current paths arranged in parallel between said reference voltage node and said intermediate node, and wherein control terminals of said first input transistor and said second input transistor are configured to receive said radio-frequency amplitude modulated signal.

6. The circuit of claim 1, wherein said amplifier stage comprises an output transistor and an output load coupled between a conductive terminal of said output transistor and said reference voltage node, and wherein said output node is intermediate said conductive terminal of said output transistor and said output load.

7. The circuit of claim 6, wherein said amplifier stage further comprises:
a current-matching transistor having a current path arranged between said supply voltage node and a current control node, and a control terminal coupled to said intermediate node;
a bias source coupled between said current control node and said reference voltage node to sink a current from said current control node; and
a current-mirroring transistor having a current path arranged between said supply voltage node and said current control node, a control terminal and a drain or collector terminal coupled to said control terminal;

wherein the control terminal of said current-mirroring transistor is coupled to a control terminal of said output transistor.

8. The circuit of claim 7, further comprising a current-matching resistive element coupled between said supply voltage node and said current control node.

9. The circuit of claim 8, wherein said current-matching resistive element has a resistance value in a range of 25 kΩ to 50 kΩ.

10. The circuit of claim 6, wherein said output transistor is arranged in one of a common source or common emitter configuration, with said conductive terminal comprising one of a drain or collector, respectively.

11. The circuit of claim 10, further comprising:
a radio-frequency antenna configured to receive said radio-frequency amplitude modulated signal; and
a PWM demodulator circuit configured to demodulate said pulse-width modulated output signal to generate an output digital data signal.

12. The circuit of claim 10, further comprising:
a transmitter circuit configured to transmit said radio-frequency amplitude modulated signal; and
wherein the transmitter circuit is isolated by a galvanic isolation barrier from a receiver circuit that includes said rectifier stage, said amplifier stage and comparator circuit.

13. The circuit of claim 12, wherein the transmitter circuit and the receiver circuit are provided as separate chips arranged on respective electrically-isolated die pads, and wherein said galvanic isolation barrier is provided by a molded package on the separate chips.

14. The circuit of claim 1, further comprising a comparator circuit configured to compare said amplified rectified signal to a threshold signal to generate a pulse-width modulated output signal indicative of the envelope of said radio-frequency amplitude modulated signal.

15. A circuit, comprising:
a rectifier stage including:
a differential input transistor pair coupled between a reference voltage node and a first intermediate node, the differential input transistor pair being configured to receive a radio-frequency amplitude modulated signal;
an active load circuit comprising:
a load transistor having a current path coupled between said first intermediate node and said supply voltage node; and
a low-pass circuit comprising a series circuit formed by a resistor and capacitor coupled in series between said first intermediate node and said supply voltage node, wherein a second intermediate node of said series circuit is connected to a control terminal of said load transistor; and
a resistive element coupled between said intermediate node and said supply voltage node in parallel with said load circuit;
wherein a rectified signal indicative of an envelope of said radio-frequency amplitude modulated signal is produced at said intermediate node; and
an amplifier stage coupled to receive said rectified signal from said intermediate node and configured to produce an amplified rectified signal at an output node.

16. The circuit of claim 15, wherein said resistor of the series circuit is connected between the first and second intermediate nodes, and wherein said capacitor of the series circuit is connected between the second intermediate node and the supply voltage node.

17. The circuit of claim 15, wherein said resistive element has a resistance value in a range of 25 kΩ to 50 kΩ, and wherein resistor of the series circuit has a resistance value in a range of 1 MΩ to 3 MΩ.

18. The circuit of claim 15, wherein said differential input transistor pair comprises a first input transistor and a second input transistor having current paths arranged in parallel between said reference voltage node and said intermediate node, and wherein control terminals of said first input transistor and said second input transistor are configured to receive said radio-frequency amplitude modulated signal.

19. The circuit of claim 15, further comprising a comparator circuit configured to compare said amplified rectified signal to a threshold signal to generate a pulse-width modulated output signal indicative of the envelope of said radio-frequency amplitude modulated signal.

20. A circuit, comprising:
a rectifier stage including:
a differential input transistor pair coupled between a reference voltage node and an intermediate node, the differential input transistor pair being configured to receive a radio-frequency amplitude modulated signal;
a load circuit coupled between the intermediate node and a supply voltage node; and
a resistive element coupled between said intermediate node and said supply voltage node in parallel with said load circuit;
wherein a rectified signal indicative of an envelope of said radio-frequency amplitude modulated signal is produced at said intermediate node; and
an amplifier stage comprising:
a current-matching transistor having a current path arranged between said supply voltage node and a current control node, and a control terminal coupled to said intermediate node;
a bias source coupled between said current control node and said reference voltage node to sink a current from said current control node; and
a current-mirroring circuit having an input current path arranged between said supply voltage node and said current control node and having an output current path arranged between said supply voltage node and an output node where an amplified rectified signal is produced.

21. The circuit of claim 20, further comprising a current-matching resistive element coupled between said supply voltage node and said current control node.

22. The circuit of claim 21, wherein said resistive element has a resistance value in a range of 25 kΩ to 50 kΩ, and wherein said current-matching resistive element has a resistance value in a range of 25 kΩ to 50 kΩ.

23. The circuit of claim 20, wherein said differential input transistor pair comprises a first input transistor and a second input transistor having current paths arranged in parallel between said reference voltage node and said intermediate node, and wherein control terminals of said first input transistor and said second input transistor are configured to receive said radio-frequency amplitude modulated signal.

24. The circuit of claim 20, further comprising a comparator circuit configured to compare said amplified rectified signal to a threshold signal to generate a pulse-width modulated output signal indicative of the envelope of said radio-frequency amplitude modulated signal.

* * * * *